United States Patent [19]

Hovekamp

[11] 3,983,758
[45] Oct. 5, 1976

[54] AUTOMATIC PROCESSOR FOR OFFSET PLATES

[75] Inventor: John C. Hovekamp, Mansfield, Ohio

[73] Assignee: Buckler Industries, Inc., Mansfield, Ohio

[22] Filed: Nov. 5, 1974

[21] Appl. No.: 520,925

Related U.S. Application Data

[62] Division of Ser. No. 350,129, April 11, 1973, Pat. No. 3,896,470.

[52] U.S. Cl. .................................. 74/45; 74/25
[51] Int. Cl.² ............................. F16H 21/18
[58] Field of Search ............. 74/70, 25, 579, 45

[56] References Cited
UNITED STATES PATENTS

| | | | |
|---|---|---|---|
| 921,363 | 5/1909 | Chrysler et al. | 74/579 |
| 1,829,305 | 10/1931 | Sneed | 74/579 |
| 2,567,974 | 9/1951 | Scott | 74/25 |
| 2,685,260 | 8/1954 | Auger | 74/25 |
| 2,844,965 | 7/1958 | Stelljes et al. | 74/70 |

Primary Examiner—Samuel Scott
Assistant Examiner—Wesley S. Ratliff, Jr.
Attorney, Agent, or Firm—Cain and Lobo

[57] ABSTRACT

An automatic integrated processor which sequentially develops, washes and, if desired, applies gum to the exposed surface of an offset photolithographic plate in appropriately separated processing stages. The exposed surface of the plate is subjected to a linear, reciprocating rubbing action by plural sponges, which rubbing action produces results surprisingly similar to those produced by a manual rotary action. A fully assembled processor of this invention requires only that it be connected to a water supply, a source of power, and to a reservoir for used, waste fluids. A single electric motor is adapted (a) to drive plural pairs of coupled drive rolls, (b) to reciprocate the sponges in frictional contact with a generally horizontal offset plate and (c) to agitate angularly disposed containers for developer and gum. The translation of the rotary motion of the electric motor to linear reciprocation in mutually orthogonal planes is effected by direct rod-actuated drives with swivel rod-ends. The fully assembled processor may be transported through a standard 36" wide doorway, eliminating the drawbacks characteristic of machines which are to be assembled at the installation site.

7 Claims, 8 Drawing Figures

AUTOMATIC PROCESSOR FOR OFFSET PLATES

CROSS REFERENCE TO RELATED CASES

This application is a division of applicants's copending application, Ser. No. 350,129 filed April 11, 1973, now Pat. No. 3,896,470.

BACKGROUND OF THE INVENTION

Though manual development, washing and gum application, also referred to as "gumming", is still practiced by the occasional user of photolithographic plates, the large scale commercial utilization of offset plates has made automatic processing of exposed plates an economic necessity. Numerous machines have been proposed to execute otherwise manually performed tasks and have met with qualified success. Machines specifically adapted to process exposed photolithographic plates automatically are disclosed in U.S. Pat. Nos. 3,608,464; 3,593,641; 3,589,261; 3,562,834; 3,448,720; and others.

In general, the more successful machines have emulated the rotary, heretofore manual movement, particularly for the development of the plate. Consequently, it has been popularly believed that failure of other modes of mechanical rubbing motion as a substitute for manual rubbing is a foregone conclusion.

Moreover, the more successful machines are relatively large, enormously complicated and, not unexpectedly, require a capital investment which precludes their acquisition by a small user of plates. With respect to size, it is noted that available machines, for plates from about 25 inches to about 33 inches in width, will not pass, fully assembled, through a standard 36 inches wide doorway and consequently must be assembled at the installation site, preferably by a qualified factory representative. Similarly a factory-trained maintenance person is generally required to diagnose and rectify malfunctions of prior art machines due to the complicated inter-relationship of moving parts and the large number of electrical circuits. Thus, there has been a growing need for a simple, inexpensive automatic plate processor which will not only be easy to acquire but easy to maintain; and which is mechanically as ruggedly as it is photographically, routinely reproducible in results. This invention is directed to such a need.

SUMMARY OF THE INVENTION

It is, therefore, a general object of this invention to provide a new and improved apparatus for converting rotary motion about a first axis to linear reciprocating motion along a second axis in transversely spaced relationship with the first axis.

It is another general object of this invention to provide a new and improved self-contained, integrated automatic processor for exposed lithographic plates typified by those used in modern offset printing machines.

It is a further general object of this invention to provide a new and improved self-contained, integrated automatic processor, for exposed lithographic plates typified by those used in modern offset printing machines which processor may be delivered to a purchaser, ready-to-use, requiring only that it be connected to a water supply, optionally a recirculating water supply, a source of power, and a reservoir for disposal of used processing fluids.

It is a more specific object of this invention to provide an automatic processor which utilizes simple components, coacting in the framework of a disciplined geometry, wherein a main requirement is that a fully assembled machine may be transported through a standard 36 inches wide doorway.

It is another object of this invention to provide a machine, less than 36 inches wide in the direction of travel of an exposed plate being processed, in which width a developing stage, a washing stage and a gumming stage are coplanarly disposed, but essentially compartmentalized by at least three pairs of coupled drive rolls which perform the dual function of minimizing contamination of fluids into adjacent stages and of transporting the exposed plate, sequentially, through each stage.

It is a particular object of this invention to emulate the process results of a desirable, manual rotary motion for rubbing the exposed surface during processing, by utilizing a surprisingly effective, simple rectilinear reciprocating motion, transmitted to rubbing surfaces such as sponges, which engage the exposed surface of the plate in frictional sliding contact.

It is another object of this invention to provide an automatic machine with a linearly reciprocable, integral agitator or shaker for bottles or containers of difficulty homogenizable processing fluids.

It is still another object of this invention to effect (a) positive, accurate transport of the exposed plate by the drive-rolls, (b) linear reciprocation of the sponges and (c) continuous agitation of the processing fluid containers, by dual, gear-reduction drive means driven by, and disposed on either side of, a single electric motor.

It is also a specific object of this invention to provide a machine with built-in safeguards both for the operator and the plate being processed; specifically, a torque limiter for the drive mechanism of the drive-rolls defeats transport of a plate which is advertently fed askew; the supply of chemicals may be adjusted both in flow rate and location to avoid splashing; and out-of-phase reciprocating sponges, spaced apart from each other at a distance less than the length of a plate, negates the net torque generated by the sponges during development of a thin plate.

It is another, more particular object of this invention to provide direct, uniquely adapted, plural, rod-actuated drives (1) for oscillating, simultaneously, at least one pair of shafts, one in an opposite direction from the other, to provide out-of-phase reciprocating action to contiguous sponges in a generally horizontal plane, coplanarly with the exposed surface of the plate, and (2) for agitating the fluid containers in a plane orthogonal to the horizontal plane. The plural drives may be effectively operated, without binding, though one end of each of three rods is journalled on a single stub shaft rotatable in a vertical plane.

It is still another specific object of this invention to provide a novel and improved apparatus for shaking difficultly miscible liquids wherein the liquids' containers are angularly disposed in a substantially vertical plane and linearly reciprocated by direct rod means driven by a rotary drive means not in the same vertical plane.

A still further object of this invention is to provide a new and improved apparatus for converting rotary motion about a first axis into linear reciprocating motion along a second axis in transversely spaced relationship with said first axis, a new and improved automatic processor for offset plates, a new and improved process for developing and washing exposed offset plates, and a new and improved shaker for agitating a difficultly miscible liquid, each of which obtains one or more of the objects and advantages set forth hereinabove.

These and other objects, features and advantages of the processor of this invention will become apparent to those skilled in the art from the following description of preferred forms thereof, reference being had to the accompanying drawings.

BRIEF DESCRIPTION OF THE DRAWINGS

In the figures of the drawing, like reference numerals are used to denote like parts. Some of the parts are dimensionally exaggerated for clarity of illustration and to facilitate the description of the drive means and the manner in which it benefits the operation of the automatic processor.

DETAILED DESCRIPTION OF PREFERRED EMBODIMENTS OF THE INVENTION

According to the present invention, the automatic offset plate processor develops, washes and applies gum to an exposed photopolymer aluminum lithographic plate on which a wipe-on or presensitized offset planographic printing plate image may be developed as is described in U.S. Pat. Nos. 3,448,720 and 3,562,834, inter alia.

It will be understood that the self-contained processor of this invention is a complete and continuous processor, which in addition to sequential developing and washing stages, provides a coating of gum arabic to preserve the plate. It will be apparent that, should normal preservation of the plate be dispensed with, the apparatus to be described hereinafter may be easily modified to exclude the gumming step.

A self-contained or integrated processor is one in which all the desired steps that are prerequisites of the ultimate in plate-processing are carried out, automatically, once the machine is placed in operation, except for feeding each plate into the infeed or feed-end and recovering processed plates from the out-feed or discharge end. An integrated processor is placed in operation by moving a fully-assembled processor into the processing room, connecting it to a water-supply, a source of power, such as any available electric supply at conventionally designated line voltage, and a drain to a reservoir or treating facility adapted to receive and dispose of waste processing chemicals. The processor is referred to as being complete, because with the fluid containers provided with suitable chemicals, only wash water need be supplied before the machine is connected to a source of power for its automatic operation.

Exposed plates are fed exposed surface upward, usually manually, individually and sequentially, permitting essentially continuous operation. Operation of the machine may be interrupted at will, for example, to replenish processing chemicals, for work recesses, and the like, without having to make more than simple, routine adjustments, if any.

Figure 1:
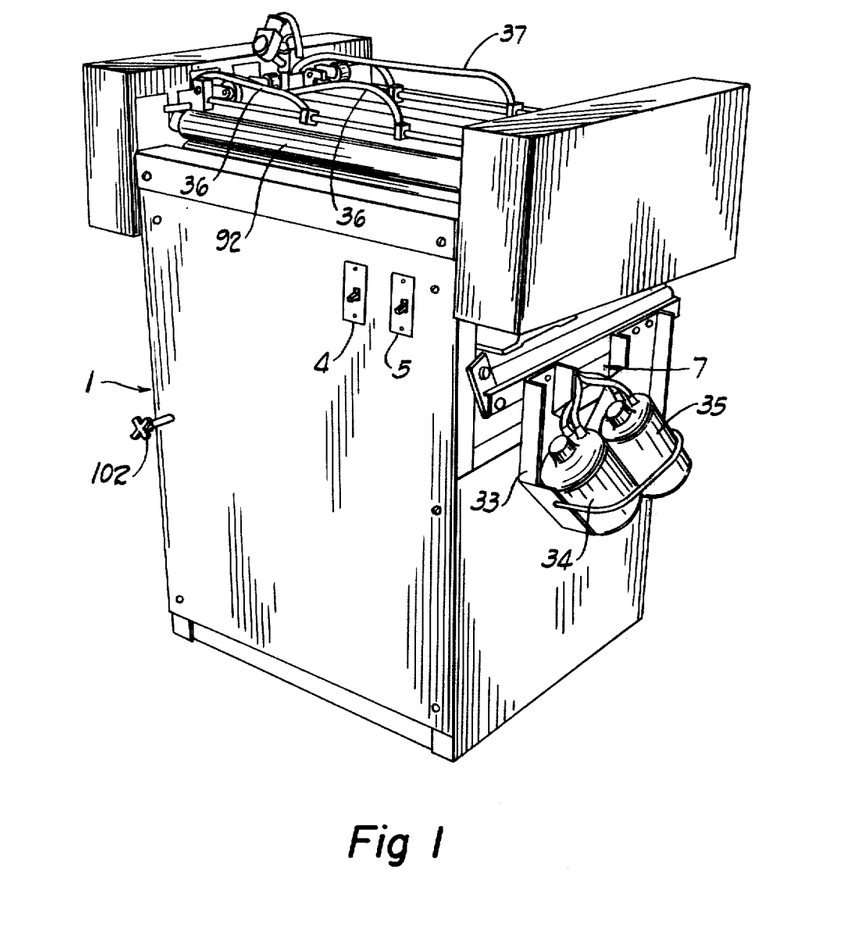
FIG. 1 is a perspective view of the automatic offset plate processor of this invention, from the receiving or infeed end of the machine where plates are fed into a first pair of drive rolls.

Referring now to FIG. 1, there is illustrated a self-contained automatic offset lithoplate processor indicated generally at 1, with covers to protect (a) a chain drive mechanism, for receiving, transporting, and discharging a plate, (b) sponges or applicator means having a rod-actuated drive mechanism adapted to reciprocably rub the exposed surface of the plate, and (c) pump means for supplying chemicals, and other components, as will be described hereinafter. The processor is placed in fluid communication with a source of washing fluid, preferably water, by connecting it with a water supply, and a power-cable from the processor is plugged into a line receptacle (details not shown). The length of the processor in the direction of travel of a plate, is less than 36 inches, with all the covers on, and fully assembled.

Processing chemicals, such as are well-known in the art, for developing and gumming the exposed plate, are difficult to maintain in homogeneous solution. They are, therefore, continuously agitated in a shaker, indicated generally at 7. The shaker 7 is disposed below a rod-actuated drive mechanism (see FIG. 2), covered in FIG. 1, on the right hand side of a person positioned so as to present a plate to the infeed end of the processor. In descriptions hereinafter, the right hand side of the processor will be referred to as the front and the opposite, or the left hand side, will be referred to as the rear of the machine.

Figure 2:
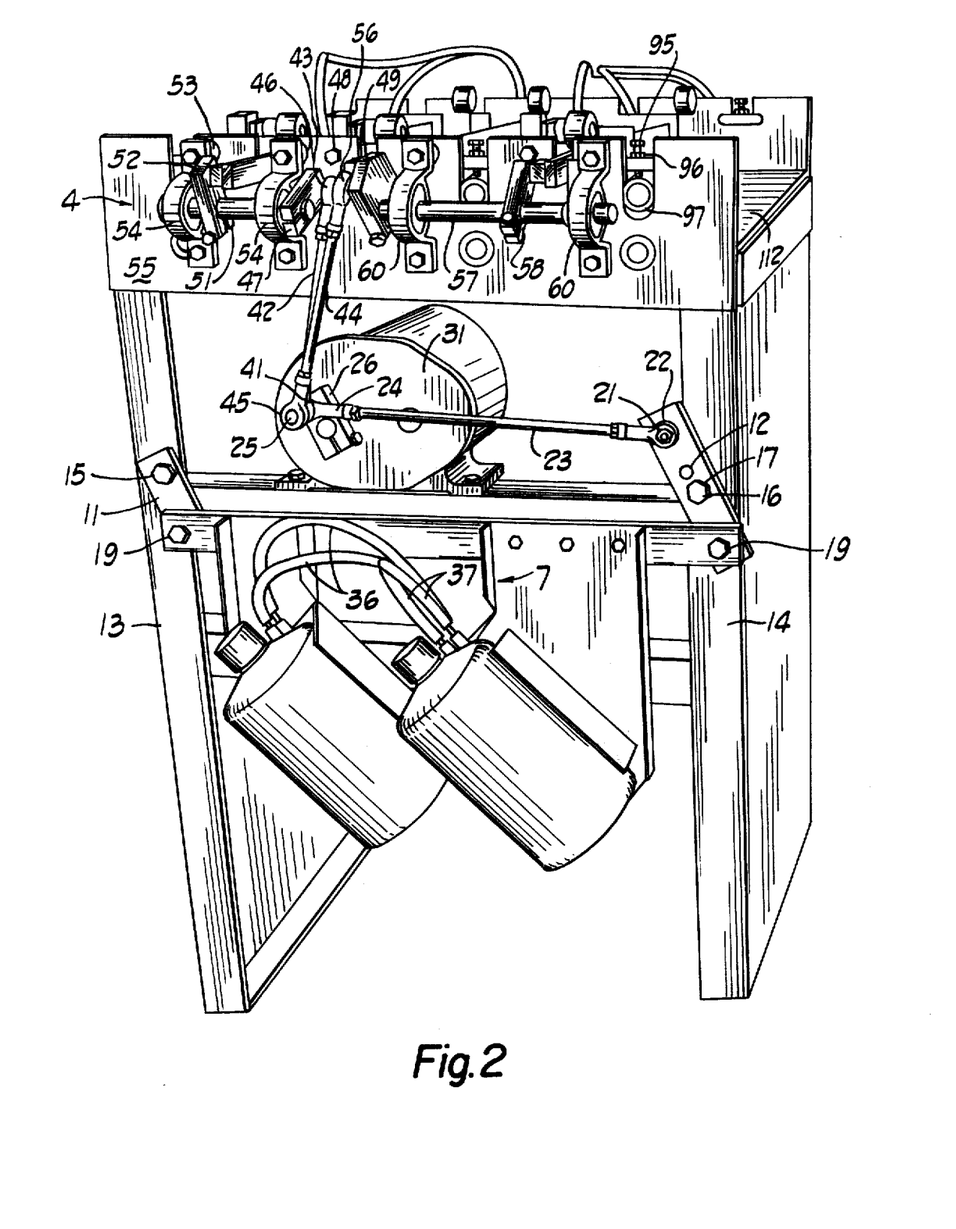
FIG. 2 is an elevation perspective view of the right side of the processor showing the direct rod-actuated drives for reciprocating the sponges and simultaneously shaking the fluid containers.

Referring now to FIG. 2, the shaker comprises a pair of rocker arms 11 and 12 pivotally disposed on vertical frame members 13 and 14 which are part of the support structure of the processor. Suitable pivots 15 are provided by bolts 16 journalled in bearing means 17, preferably ball bearings, secured in the rocker arms. The lower end of each rocker arm 11 and 12 pivotally supports a horizontal support bar 18 near its end, at pivot 19, preferably utilizing a similar bolt and bearing means as those described immediately hereinbefore. The upper end of the rocker arm 12 is provided with a bolt or pin 21 on which is pivotally secured a swivel rod-end 22 or a rod 23, the other end of the rod 23 also having a swivel rod-end 24 pivotally disposed on a stub-shaft or pin 25. The stub-shaft 25 projects from a rotatable crank arm 26 driven by any suitable drive means. Preferred drive means is a variable speed reduction gear means 31 powered by a motor means such as an electric motor 32 (see FIG. 4).

It will be recognized that swivel rod-ends are desirable to accommodate angulation of any rod which otherwise would 'bind'. Because the rod 23 may be disposed on the stub shaft 25, so as to place the rod 23 in essentially the same vertical plane as the rocker arms 11 and 12 and the support bar 18, the bottles may be agitated by a parallelogram motion imparted by a rod 23 without swivel ends. However, the use of swivel ends permits such flexibility, with respect to the plane of movement of the rod 23, as is necessary in this particular embodiment when the vertical plane is not the same. Other means may be used for this purpose, such as, for example, a flexible rod with predetermined rigidity, so chosen as to flex to the extent necessary to permit angulated motion of the flexible rod which may utilize conventional, fixed or non-swivelling rod-ends. Alternatively, a conventional rod with fixed rod-ends may be modified by sectioning the rod to provide at least two spring-connected sections. A rod end on one section may be pivotally disposed on the stub shaft 25, and a rod end on the other section may be pivotally disposed on the bolt 21. A longitudinally flexible spring, of predetermined rigidity, which will flex during operation sufficiently to permit angulated transmission of the rotary motion of the stub shaft 25, without binding, may be disposed intermediate the two rod sections. Still another means, utilizing direct rod actuation, includes a rod with conventional, fixed rod-ends and a universal joint intermediate its length.

It will also be recognized that the rotary movement of the crank arm may be converted to the desired rocking motion of the support bar by utilizing a flexible cable and an oppositely directed spring return, instead of a direct-rod actuated means; but a flexible cable and spring return is generally not as satisfactory as direct rod actuation.

The support bar 18 has fixedly disposed thereon a bottle holder or carriage 33 adapted to hold a developer bottle 34 and a gum bottle 35. The bottles 34 and 35 are angularly, removably disposed in the holder 33, preferably at an angle in the range from about 30° to 50° from the horizontal, and most preferably at about 45°, by a spring 38. It has been discovered that an angularly disposed fluid container provides surprisingly good mixing and reliably maintains homogeneity of the fluids. A pair of developer fluid lines 36 and a pair of gum lines 37 conduct developer and gum from the bottles 34 and 35 respectively.

Rotation of the crank arm 26 produces a back-and-forth rocking motion of the rocker arm 12 and reciprocates the bottles 34 and 35. Fluids from the bottles are conducted through lines 36 and 37 and applied to the exposed surface of a plate to be processed, as will be described hereinafter.

Figure 3:
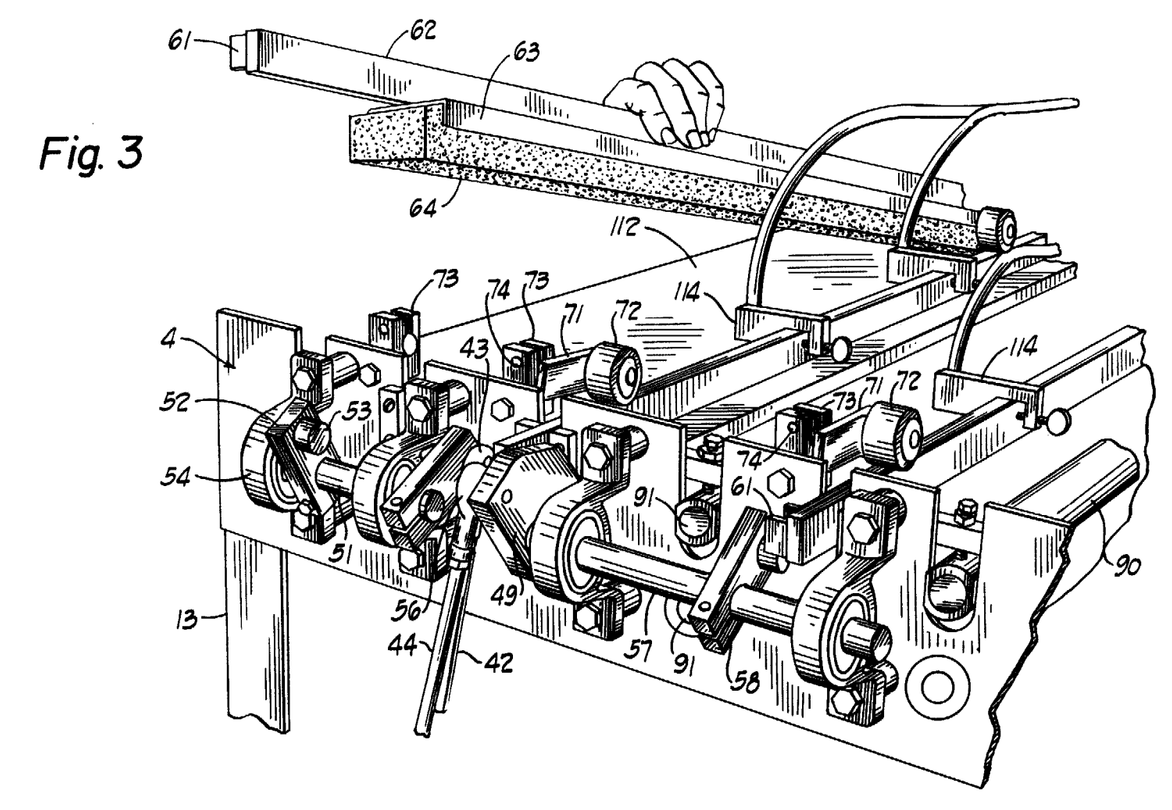
FIG. 3 is a partial plan view, in perspective, of the right side of the processor showing direct rod means for reciprocating the sponges, and the manner in which the sponges are manually replaced.
Figure 6:
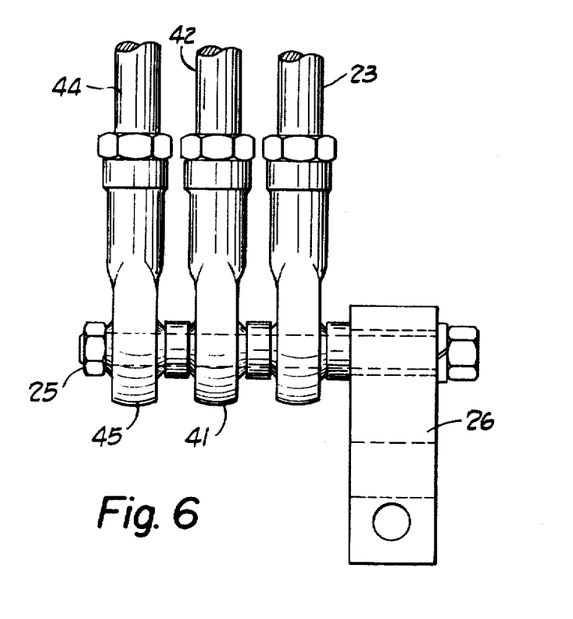
FIG. 6 is a fragmentary enlarged view, from the infeed end, showing three rod-ends journalled in a stub shaft in a crank arm.
Figures 7, 8:
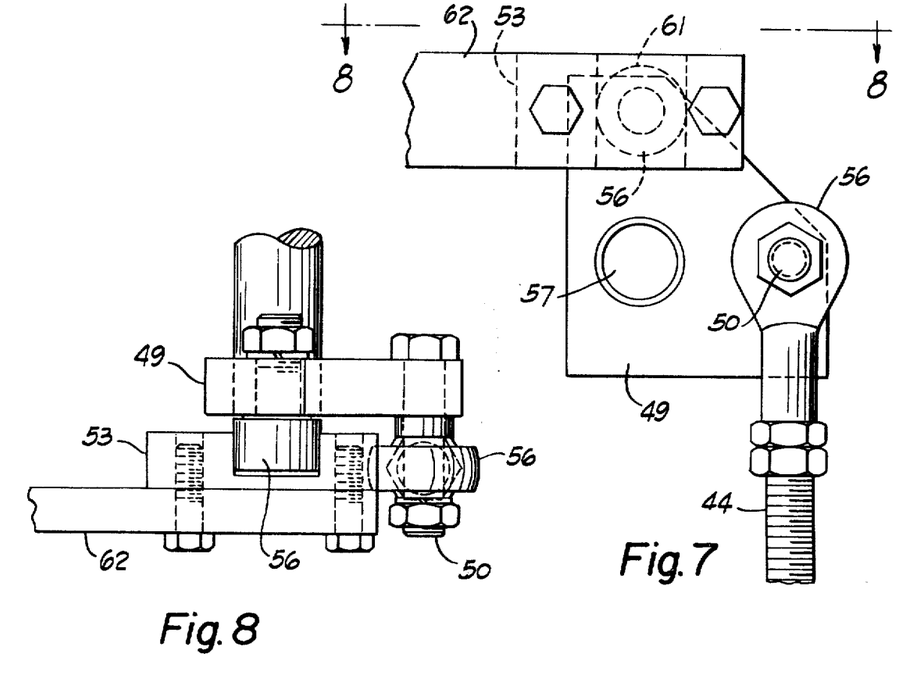
FIG. 7 is a fragmentary enlarged view, from the infeed end, showing a rocker arm for the intermediate sponge bar assembly and a rod-end pivotally disposed on the rocker arm.
FIG. 8 is a fragmentary enlarged plan view of FIG. 7.

Referring further to FIG. 2, and also to FIGS. 3 and 6, the stub shaft 25 has pivotally disposed thereon swivel rod-ends 41 and 45 of rods 42 and 44 respectively. The other swivel rod-end 43 of the rod 42 is pivotally disposed on a pin 46 projecting from a rocker arm 47. The rocker arm 47 is secured on a first shaft 51, at a predetermined angle in such a manner as to impart a rocking motion, symmetrically about a vertical axis, to a second rocker arm 52 provided with a cam 53. The first shaft 51 is journalled in bearings 54 in pillow blocks mounted on a front, or right hand, side-plate 55. The swivel rod-end 48 of rod 44 is pivotally disposed on a pin 50 secured in a rocker plate 49. The rocker plate 49 has a projecting cam 56 (see FIGS. 7 and 8) disposed at the same distance from a second shaft 57, on which it is fixedly secured, as the pin 50. Another rocker arm 58, with a cam 59, is secured on the second shaft 57 intermediate bearings 60 in which the shaft 57 is journalled. The bearings 64, in pillow blocks, are mounted on the side-plate 55. The rocker arm 47 and the rocker plate 49 are so connected by the rods 42 and 44 to the stub shaft 25 as to provide out-of-phase oscillations of the first and second shafts; preferably, when the first shaft rotates clockwise, the second shaft rotates counter-clockwise. As explained hereinbefore, though swivel rod-ends are preferred, other direct rod-actuated means which will permit angulation during operation may be used.

Each of the cams on the rocker arm 52, the rocker plate 49 and the rocker arm 58 is engaged in cam follower blocks 61 provided near one end of a sponge bar assembly. Each sponge bar assembly comprises a bar 62 which extends to the left hand side of the processor. The sponge bar 62 supports a channel 63 in which an elongated sponge 64 is removably disposed. A similar intermediate sponge and a gum sponge (neither shown) are also removably disposed by any suitable means, such as prongs, in three similar sponge assemblies. Each of the sponges is so disposed as to be in frictional sliding contact with the plate to be processed, the sliding contact being actuated by the action of the cams and cam follower blocks. Commercially available sponges, natural or synthetic are preferred, though any suitable resilient porous surface will provide an adequate rubbing surface. The rocker arms 52 and 58 and rocker plate 49 reciprocate the sponge bar assemblies rectilinearly across the plate in a direction orthogonal to the direction of travel of the plate as it is processed. The sponges reciprocated by rocker arm 52 and rocker plate 49 are referred to as a pair of developing sponges, and the sponge reciprocated by rocker arm 58 is referred to as a gumming or gum sponge. As will presently be apparent the sponge reciprocated by rocker plate 49, also referred to as the intermediate sponge, performs a dual function, the edge on the infeed or plate-feeding side rubbing developer solution, and the edge on the outfeed or plate-discharging side, rubbing washing water over the plate. Simultaneous, oppositely directed reciprocation of the pair of developing sponges, relative to each other, balances and offsets the torques generated by the sponges so as not to damage an offset plate fed to the processor.

Figure 5:
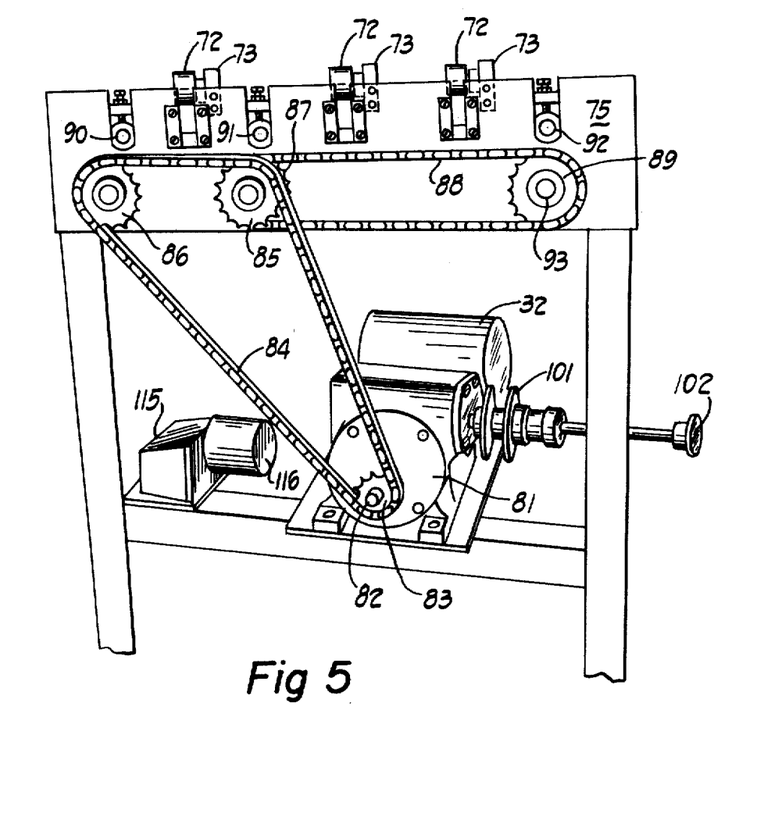
FIG. 5 is a side elevation perspective view, partially broken away for clarity, of the chain drive for driving the pairs of coupled drive rolls.

Each sponge bar assembly is provided near each end with adjustable pressure means, to set a desired rubbing pressure for each sponge. This may be effected by a Z-shaped roller pressure arm assembly 71 having a pressure roller 72 rotatably disposed on one end, and the other end adjustably, fixedly disposed in a block 73 mounted to the front side-plate 55. Similar roller pressure arm assemblies are disposed in blocks on a rear side-plate 75 (as seen in FIG. 5). The block 73 is split and provided with a bolt 74 to fixedly secure one end of the roller pressure arm.

Figure 4:
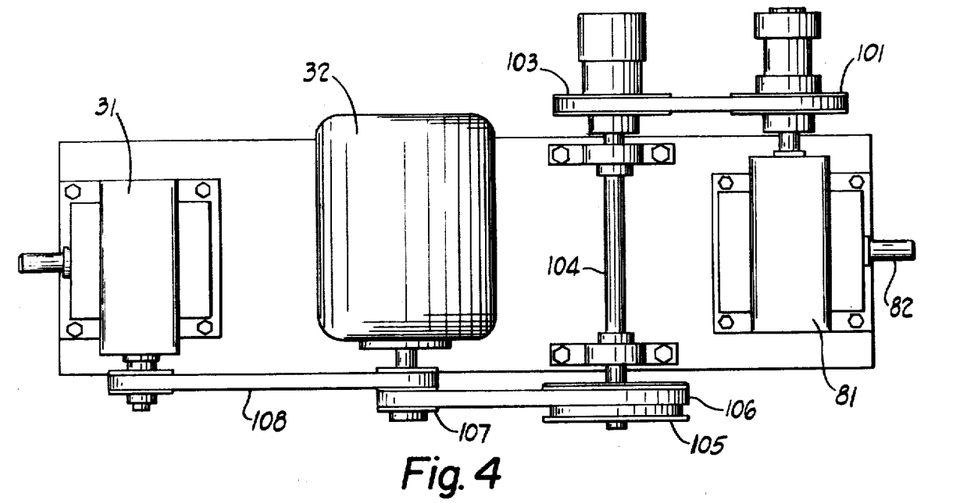
FIG. 4 is a plan view of a single motor drivingly engaged with gear reducers disposed on opposite sides of the motor.

Referring now to FIGS. 4 and 5, a reduction gear means or gear reducer 81 is disposed on the other side of the electric motor 32, that is opposite from the reduction gear means 31, and is drivingly engaged with the motor 32, as will be described hereinafter. The reduction gear means 81 is provided with a shaft 82 on which a 12-pitch sprocket 83 is keyed. A drive chain 84 is operatively trained upon the sprocket 83 and sprockets 85 and 86 which are disposed above sprocket 83. Sprocket 85 is keyed to the lower of a pair of coupled drive rolls 91, also referred to as wash rollers, adapted to pressingly receive an offset plate therebetween and urge it onwards. Sprocket 86 is keyed to the lower of a pair of coupled drive rolls 90, also referred to as gum rolls, and which are also adapted to pressingly receive a plate there between and urge it onwards. Sprockets 85 and 86 are preferably 17-pitch sprockets, and in operation, impart the same rotational speed to the coupled drive roll pairs 91 and 91. The lower roll of the wash roll pair 90 is provided with a second sprocket 87, keyed to the same shaft as sprocket 85, and substantially abutting it. A drive chain 88 is operatively trained on the sprocket 87 and drivingly engages a sprocket 89 which is keyed to the lower of a pair of coupled drive rolls 92, also referred to as feed rolls, adapted to receive an offset plate therebetween and to urge it toward the wash rolls 91. The sprocket 89 is preferably a 20-pitch sprocket and is provided with a torque limiter 93 with an adjustable running torque, such as is commercially available from Morse Chain.

The gear reducer 81 is provided with a variable speed drive, such as is commercially available from Browning, which includes a manually controlled sheave 101 with a control knob 102 which permits choice of a desired driven speed. The correct speed is held by spring tension. The variable speed drive also includes a spring loaded sheave 103 fixedly disposed on one end of a shaft 104 of a drive-belt relay. The other end of the shaft 104 is provided with a flanged sheave 105 on which a timing belt 106 is trained and then drivingly engaged on a wide sheave 107 keyed to the shaft of the electric motor 32. The sheave 107 is wide enough to accommodate two timing belts 108 and 106 which respectively drive the reduction gear 31 and the flanged sheave 105. The flange on the motor side of the sheave 105 serves to minimize the interference of one belt with the other on the sheave 107.

The drive rolls pairs and sponge assemblies are disposed between side-plates 55 and 75 above a drain pan. A deck 112, with suitable drain means to permit liquids to run into the drain pan is so disposed between the side plates 55 and 75 as to support an offset plate of predetermined width in a face upward position during processing, that is, with the exposed surface of the plate facing upward. It is preferable to provide a slight incline for the deck 112, such as, for example, 1 inch in 27 inches, the deck sloping downwards towards the outfeed end of the processor. The sponges 64 are in abutting, rubbing contact with the deck, the desired pressure being adjustably by loosening the bolt 74, pressing down on the roller 72 and securely tightening the bolt 74.

The processor, replete with necessary chemicals for developing an offset lithoplate and protecting the developed plate, is placed in operation by switching on the electric motor 32 and individual gear motors for each of the chemicals, by means of switches 4 and 5 seen on the feed-end panel of the machine in FIG. 1. The speeds of the gear motors are preselected to pump a predetermined amount of chemicals.

Developing fluid is applied to the exposed surface of a plate as soon as it is fed through feed rolls at the infeed end of the processor. Developing fluid is conveniently provided through plural flexible tubes 36 which deliver fluid from a bottle in the shaker. The tubes 36 are positioned, intermediate the feed rolls 92 and the first developing sponge 64a, by brackets 114 which are adjustably disposed on the sponge bar 62 of the first developing sponge. The developing fluid is pumped from the bottle by any conventional pumping means such as a rotary pump 115 driven by a variable speed gear motor 116. It is preferred to use a separate rotary pump for each tube which dispenses developing fluid, only one of which is shown in FIG. 5.

Developing fluid applied to the plate is rubbed by first one, and then the other of the pair of developing sponges. The feed rolls 92 continue to urge the plate onwards to the wash rolls 91. The correct or most desirable roller pressure between the rolls of each pair of coupled drive rolls is set by a lock nut 96 and adjusting screw 95 adapted to exert pressure on roller bushings 97.

Water for the washing stage is provided by a water wash spray bar having a plurality of holes (not shown) through which water is jetted into the nip of the wash rolls 91. The water serves to rinse the developed plate, and the second of the pair of developing sponges provides an additional power washing and scrubbing action.

The wash rolls 91 squeeze excess water from the plate and urges the plate to the gumming stage. The wash rolls also serve to anchor the plate, as it travels, so that the simultaneous rubbing action, in the same direction, of the second developing sponge and the gumming sponge, does not torque the plate excessively.

For gumming the plate, gum is applied intermediate the wash rolls 91 and the gum sponge in a manner analogous to the application of developing fluid, through gum dispensing flexible tubes 37 which are positioned, adjustably, with brackets 114 on the gum sponge bar. Again, as before, gum is pumped from the gum bottle by any conventional pumping means such as a rotary pump driven by a variable speed gear motor, and a separate pump for each tube is preferred. The gum is rubbed onto the surface of the plate by the gum sponge and is urged towards the gum-rolls 90 where excess gum is squeezed from the plate. The plate is discharged from the gum rolls, fully developed and coated with a protective coating of gum.

It will be apparent from the foregoing description of the instant automatic processor that the developing, washing and gumming stages are essentially compartmentalized, that is, substantially separate and distinct from each other. The developing stage is defined by the zone between the developing rolls and the infeed edge of the intermediate or second of the pair of developing sponges; the washing stage is defined by the zone between the outfeed edge of the intermediate sponge and the wash rolls; and the gumming stage is defined by the zone between the wash rolls and the gum rolls. The slight incline of the deck, sloping downwardly from the infeed to the outfeed ends of the processor, ensures a flow of liquids toward outfeed end and at the same time, helps prevent undue contamination of developing fluid by water, and contamination of the water by gum respectively.

It will also be apparent that, for economy of utilization of chemicals, a multiplicity of plates is most advantageously processed sequentially and essentially continuously. It will be apparent that the machine may also be operated for a single plate at a time.

Used fluids flowing off the exposed surface of a plate being processed, and through suitable openings provided in the deck 112, drain into the drain pan and thereafter into a reservoir for waste fluids. Alternatively, the drain pan may be connected directly to a waste line which may be disposed of in a suitable manner.

The apparatus of this invention is broadly applicable to any mechanism wherein a rotary motion about a first axis is to be converted to a linear or rectilinear reciprocating motion along a second axis in transversely spaced relationship with the first axis by utilizing a shaft means disposed for oscillation about the third axis which is angularly related to the second axis. Such an apparatus may be adapted for use in any machine wherein the aforementioned conversion of motion is desired, and is particularly applicable to processors of the type described herein to effect linear reciprocation of an elongate member including a rubbing means such as a brush, sponge or applicator. As is well known in the art, such processors of offset plates may include any conveyor means for the plates, such as, for example, a conveyor belt or drive rolls.

Modifications, changes, and improvements to the preferred form of the invention herein disclosed, described and illustrated may occur to those skilled in the art who come to understand the principles and precepts thereof. Accordingly, the scope of the patent to be issued herein should not be limited to the particular embodiments of the invention set forth herein, but rather should be limited by the advance of which the invention has promoted the art.

What is claimed is:

1. Apparatus for converting rotary motion about a first axis into linear reciprocating motion along a second axis in transversely spaced, parallel relationship with said first axis comprising:
   a. a crank arm means rotatable about said first axis;
   b. a stub shaft means disposed on said crank arm means and spaced from said first axis;
   c. shaft means disposed for rotary oscillation about a third axis extending transversely of and spaced from said second axis;
   d. a rocker arm means mounted on said shaft means for angular reciprocation;
   e. means mounted on and for oscillation with said shaft means and including means in spaced relationship with said third axis for providing said linear reciprocating motion;
   f. direct rod means having ends, one end of said rod means journalled on said stub shaft, the other end of said rod means being connected to said rocker arm means in spaced relation with said third axis; and
   g. means for rotating said crank arm.

2. The apparatus of claim 1 wherein said shaft means comprises plural shaft means including a first shaft means and a second shaft means, said first shaft means oscillating out of phase with said second shaft means.

3. Apparatus for converting rotary motion about a first axis into linear reciprocating motion of an elongate member along a second axis in transversely spaced, parallel relationship with said first axis comprising:
   a. a crank arm rotatable about said first axis;
   b. a stubshaft means disposed on said crank arm and spaced from said first axis;
   c. shaft means disposed for oscillation about a third axis angularly related to said second axis;
   d. a rocker arm means mounted on said shaft means for angular reciprocation;
   e. means mounted on and for oscillation with said shaft means and including means in spaced relationship with said third axis for providing said linear reciprocating motion of said elongate member;
   f. direct rod means having ends, one end of said rod means journalled on said stubshaft, the other end of said rod means being connected to said rocker arm means in spaced relation with said third axis; and,
   g. means for rotating said crank arm.

4. The apparatus of claim 3 wherein said elongate member is a rubbing means in frictional sliding contact with a surface.

5. The apparatus of claim 3 wherein said direct rod means is adapted to transmit a compressive of pushing force essentially along the longitudinal axis of said direct rod means.

6. The apparatus of claim 5 wherein said direct rod means has swivel ends.

7. The apparatus of claim 3 wherein said shaft means comprises plural shaft means including a first shaft means and a second shaft means, said first shaft means oscillating out of phase with said second shaft means, and a said rocker arm means mounted on each of said first and second shaft means.

* * * * *